(12) United States Patent
Morrison et al.

(10) Patent No.: US 11,211,315 B2
(45) Date of Patent: Dec. 28, 2021

(54) SEMICONDUCTOR PACKAGE WITH TERMINAL PATTERN FOR INCREASED CHANNEL DENSITY

(71) Applicant: Texas Instruments Incorporated, Dallas, TX (US)

(72) Inventors: Casey Thomas Morrison, San Jose, CA (US); Lee Martin Sledjeski, Johns Creek, GA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 502 days.

(21) Appl. No.: 15/784,066

(22) Filed: Oct. 13, 2017

(65) Prior Publication Data

US 2019/0115292 A1 Apr. 18, 2019

(51) Int. Cl.
*H01L 23/498* (2006.01)
*H01L 23/31* (2006.01)
(Continued)

(52) U.S. Cl.
CPC ........ *H01L 23/49816* (2013.01); *H01L 23/50* (2013.01); *H05K 1/181* (2013.01); *H01L 23/3128* (2013.01); *H01L 24/13* (2013.01); *H01L 24/16* (2013.01); *H01L 24/32* (2013.01); *H01L 24/45* (2013.01); *H01L 24/48* (2013.01); *H01L 24/73* (2013.01); *H01L 24/81* (2013.01); *H01L 2224/13101* (2013.01); *H01L 2224/16225* (2013.01); *H01L 2224/16227* (2013.01); *H01L 2224/32225* (2013.01); *H01L 2224/45124* (2013.01); *H01L 2224/45144* (2013.01); *H01L 2224/45147* (2013.01); *H01L 2224/48091* (2013.01); *H01L 2224/48227* (2013.01); *H01L 2224/48229* (2013.01);
(Continued)

(58) Field of Classification Search
None
See application file for complete search history.

(56) References Cited

U.S. PATENT DOCUMENTS

| 5,420,460 A * | 5/1995 | Massingill | ............... H01L 23/13 |
| | | | 174/260 |
| 2005/0215085 A1* | 9/2005 | Mehta | ................. G06F 13/4221 |
| | | | 439/65 |

(Continued)

*Primary Examiner* — Zandra V Smith
*Assistant Examiner* — Lawrence C Tynes, Jr.
(74) *Attorney, Agent, or Firm* — Dawn Jos; Charles A. Brill; Frank D. Cimino

(57) ABSTRACT

Described examples include an apparatus, including: a substrate having a first surface configured to mount at least one integrated circuit and having a second surface opposite the first surface, the second surface having a plurality of terminals arranged in rows and columns, and at least one row of the plurality of terminals disposed adjacent a first side and extending generally along the length of the substrate arranged in a pattern extending along a longitudinal line, the pattern including a first group of consecutive terminals extending in a first direction at a first angle to the longitudinal line and directed towards an interior of the substrate, a second group of consecutive terminals extending in a second direction at a second angle and extending towards the periphery of the substrate, and a third group of consecutive ones of the terminals extending from the second group in the first direction.

12 Claims, 8 Drawing Sheets

(51) Int. Cl.
*H01L 23/00* (2006.01)
*H05K 1/18* (2006.01)
*H05K 1/11* (2006.01)
*H01L 23/50* (2006.01)
*H05K 3/34* (2006.01)

(52) U.S. Cl.
CPC ............... *H01L 2224/48237* (2013.01); *H01L 2224/48599* (2013.01); *H01L 2224/48699* (2013.01); *H01L 2224/48799* (2013.01); *H01L 2224/73204* (2013.01); *H01L 2224/73265* (2013.01); *H01L 2224/81815* (2013.01); *H01L 2924/15311* (2013.01); *H01L 2924/181* (2013.01); *H05K 1/111* (2013.01); *H05K 3/3436* (2013.01); *H05K 2201/09418* (2013.01); *H05K 2201/10378* (2013.01); *H05K 2201/10734* (2013.01)

(56) References Cited

U.S. PATENT DOCUMENTS

2006/0145344 A1* 7/2006 Shimanuki ........ H01L 23/49827
　　　　　　　　　　　　　　　　　　　　257/737
2016/0172016 A1* 6/2016 Matsumoto ......... G06F 11/1076
　　　　　　　　　　　　　　　　　　　　365/191

* cited by examiner

SEMICONDUCTOR PACKAGE WITH TERMINAL PATTERN FOR INCREASED CHANNEL DENSITY

TECHNICAL FIELD

This disclosure relates in general to the field of packaged semiconductor devices and related processes, and more specifically to semiconductor devices in ball grid array (BGA) packages.

BACKGROUND

For applications where a semiconductor device with increasingly dense communication channels is provided in a BGA package, the requirements for printed circuit boards (PCBs) where the BGA packaged device will be surface mounted require increasing the board area for mounting the BGA packaged device. The increased area enables effective routing of traces carrying high-frequency signals from the BGA mounting area using conductive traces.

In order to support the high frequencies of communication signals, the terminals of the BGA packaged device for carrying the communication signals are placed at the periphery of the array of terminals on the BGA package. By using the periphery locations for the terminals carrying communication signals, the corresponding conductive traces on the PCB that couple to the communication signals can be routed away from the BGA device and "escape" from the BGA mounting position on the PCB without need for the use of vertical vias in the PCB, preserving high performance for the high-frequency signals and enabling smaller signal pitch than would otherwise be possible if vias were used. However, use of the periphery terminal locations for the communication signals also increases the BGA package length as additional signal terminals are added, and this increase therefore reduces the channel density/area on the PCB. Improvements are therefore needed in packaged semiconductor devices to provide semiconductor packages and corresponding PCB mounting areas with increased channel density.

SUMMARY

In a described example, an apparatus includes: a substrate having a first surface configured to mount at least one integrated circuit and having a second surface opposite the first surface, the second surface having a plurality of terminals arranged in rows and columns, first, second, third and fourth sides of the substrate forming a periphery of the substrate; and at least one row of the plurality of terminals disposed adjacent the first side of the substrate and extending generally along the length of the substrate, the at least one row of the plurality of terminals arranged in a pattern extending along a longitudinal line parallel to the first side, the pattern comprising a first group of consecutive ones of the terminals extending in a first direction at a first angle to the longitudinal line and directed towards an interior of the substrate, a second group of consecutive terminals continuing the at least one row and extending in a second direction at a second angle with respect to the first direction and extending towards the periphery of the substrate, and a third group of consecutive ones of the of the terminals extending from the second group and extending in the first direction at a third angle to the second direction and away from the periphery of the substrate.

DETAILED DESCRIPTION

Corresponding numerals and symbols in the different figures generally refer to corresponding parts unless otherwise indicated. The figures are not necessarily drawn to scale.

Certain structures and surfaces are described herein as "parallel" to one another. For purposes of this disclosure, two elements are "parallel" when the elements are intended to lie in planes that, when extended, will not meet. However, the term parallel as used herein also includes surfaces that may slightly deviate in direction due to manufacturing tolerances, if the two surfaces generally lie in planes that are spaced apart and which would not intersect when extended infinitely if the surfaces were made without these deviations, these surfaces are also parallel. Parallel surfaces extend in a direction side by side and do not meet.

BGA packages for semiconductor devices provide compact and robust packages with solder balls for surface mounting to a printed circuit board (PCB) to connect to the semiconductor device. Increasingly, high-speed communications interfaces include wider and wider bus connections with an increasing number of signals. To support high data rates, the communication signals switch at high frequencies, for example at frequencies greater than 1000 MHz. As used herein, high-frequency signals switch at greater than 100 MHz.

To enable the high-frequency signaling on a printed circuit board, it is desirable to make the connection to the solder balls of the BGA-packaged integrated circuit (IC) at peripheral locations of the array of solder balls. A peripheral location is one that is adjacent an outer edge of the packaged device. By using the peripheral locations for signal terminals, the printed circuit board traces routing signals away from the mounting area for the BGA-packaged device can be formed at the uppermost conductor level of the PCB, avoiding the need for vertical via connections in the PCB traces. The use of PCB vias can reduce the switching frequency and performance of the high-frequency signals, which is undesirable. The use of PCB vias also may require wider spacing between signal terminals to accommodate minimum via-to-via spacing rules which are part of PCB manufacturing processes. However, to place an increasing number of signal terminals on the periphery of a packaged device with a predetermined spacing between the terminals requires increasing the dimensions, such as the length, of the BGA package and a corresponding increase in the BGA mounting area on the printed circuit board.

Figure 1:
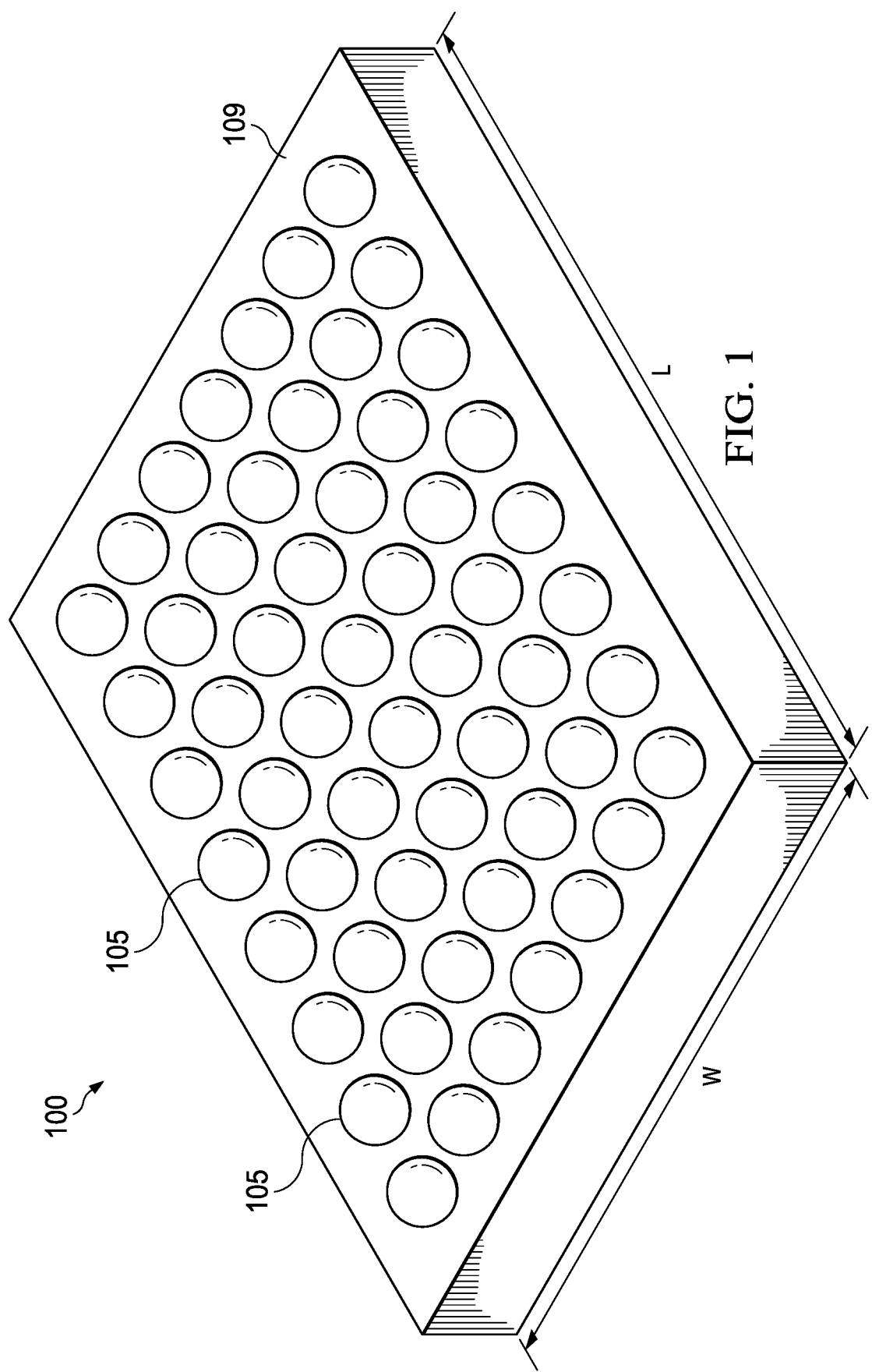
FIG. 1 is a projection view of a BGA package.

FIG. 1 is a projection view of a semiconductor package 100. In FIG. 1, the semiconductor package 100 includes an array of terminals 105 arranged in rows and columns. The terminals 105 are spaced from one from another with a uniform pitch. In the example semiconductor package 100, the terminals 105 are solder balls. A BGA-semiconductor package includes an array of solder balls as external terminals. The arrangements herein are also applicable to packages with other external terminal types. Pin terminals can be used in a pin grid array (PGA) package. Copper columns such as controlled-collapse-copper-columns (C4) or solder terminals shaped as solder columns or solder posts can be used as the terminals 105.

The semiconductor package 100 has a package body 109 that has a width W and a length L. In the example of FIG. 1, semiconductor package 100 has seven terminals in each of several columns arranged in parallel with the width direction W, and eight terminals in each of several rows arranged in parallel with the length direction L. In this example semiconductor package 100, the length L is longer than the width W because the rows have more terminals than the columns, and the pitch between terminals is a uniform distance. In another example, the spacing between terminals in different portions of the array of terminals 105 can vary. Further in the semiconductor package of FIG. 1, the array of terminals has a solder ball placed on each of the terminal positions. However in additional alternatives, some of the terminal positions can be unused and therefore have no solder ball placed on such unused terminal positions. In a BGA packaged semiconductor device, the solder balls on the terminals can be for carrying a signal, for making a power or ground connection, or can be a dummy ball that is not electrically connected (a No Connect or NC) but which provides mechanical support when the semiconductor package 100 is mounted to a printed circuit board.

For clarity of the illustration, the semiconductor package 100 is oriented with the array of terminals 105 facing the viewer as oriented in FIG. 1. When mounted to a printed circuit board (PCB), the array of terminals 105 will be positioned facing the PCB as is further described hereinbelow.

Figure 2:
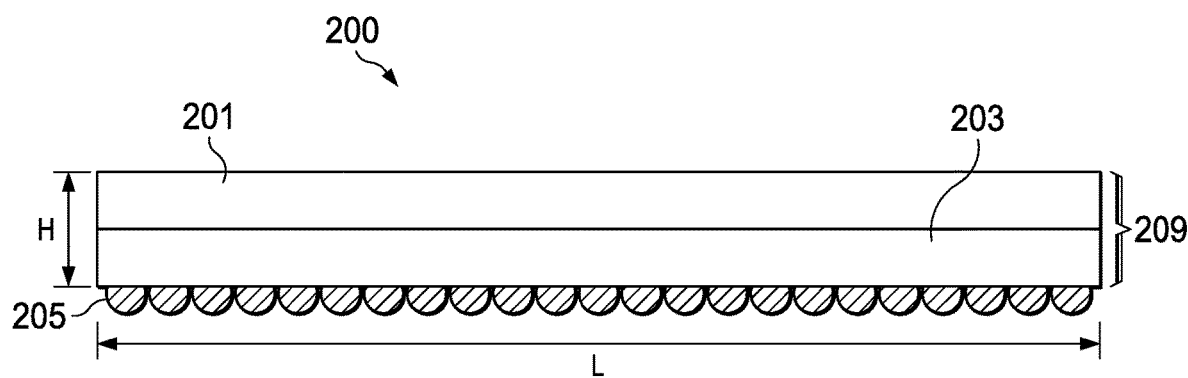
FIG. 2 is an end view of a BGA package.

FIG. 2 is an end view of a BGA package 200. Reference labels in FIG. 2 for elements similar to those shown in FIG. 1 are similar, for clarity. For example, package body 209 corresponds to package body 109. The body 209 includes a substrate 203 that has a first surface (the upper surface as the BGA package is oriented in FIG. 2) covered by a mold compound 201. An array of terminals, which are solder balls 205 in FIG. 2, is attached to a second surface (the bottom surface as oriented and shown in FIG. 2) of the substrate 203, and at least some of the solder balls 205 are electrically connected to a semiconductor device (not shown) packaged within the BGA package 200 and covered by the mold compound 201. The solder balls 205 can be mounted to a printed circuit board (not shown, described hereinbelow) to make physical and electrical connection to the BGA package 200. As oriented in FIG. 2, the BGA package 200 has four vertical sides, a first side (shown in the end view of FIG. 2), an opposing second side parallel to the first side (not visible in FIG. 2), a third side (not visible in FIG. 2) and an opposite fourth side parallel to the third side (also not visible in FIG. 2). The BGA package has a width and a length, the first and second sides extending along the length L shown in FIG. 2, the third and fourth sides extending along the width (see FIG. 1). The BGA package can be rectangular, and the rectangular shape can include a square shape when the length and the width are equal. In an example, a BGA package has 332 terminals, which are solder balls such as 205, and the BGA package has a width about 8.5 millimeters, and a length about 13.5 millimeters, and has a height H about 1.05 millimeters. BGA packages of the arrangements can have a wide variety of numbers of solder balls, and can be a variety of widths, and lengths, depending on the application. Solder balls can vary in size, in an example the solder balls have a diameter of about 0.3 mm with a pitch of about 0.5 mm spacing the balls apart. Manufacturing tolerances on a solder ball may cause additional variance in size, for example, +/−0.05 mm.

Figure 3:
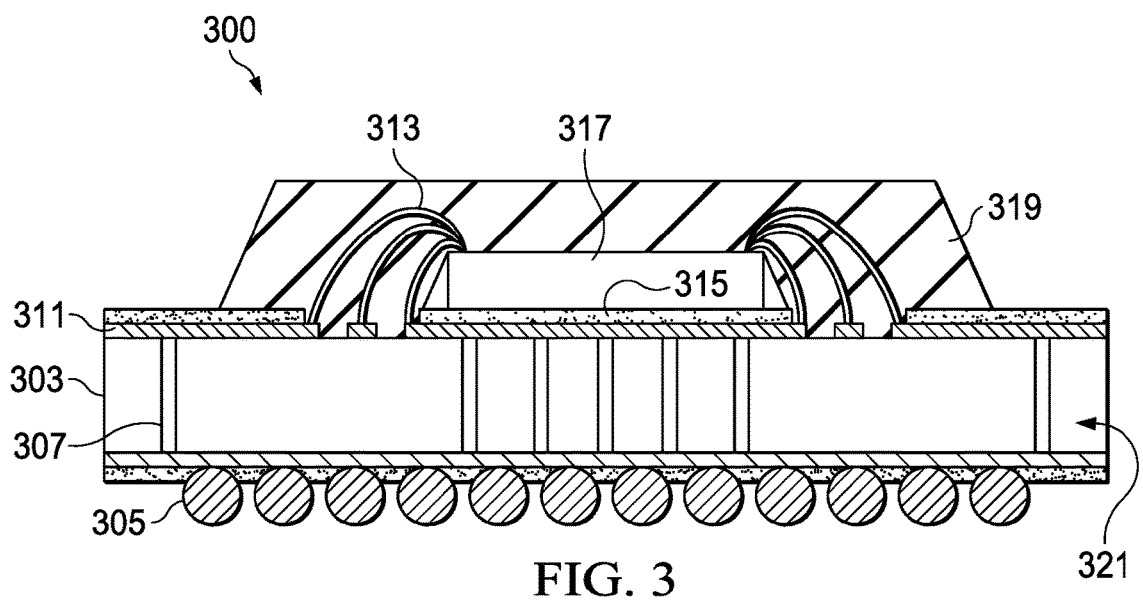
FIG. 3 is a cross section of a wire-bonded BGA package.

FIG. 3 is a cross section of a semiconductor package 300. Semiconductor package 300 is a wire-bonded BGA package. Reference labels in FIG. 3 for elements similar to those shown in FIG. 2 are similar, for clarity. For example, substrate 303 corresponds to substrate 203. In FIG. 3, a semiconductor device 317 is shown over a first surface of substrate 303 (the upper surface as the substrate 303 is oriented in FIG. 3). The semiconductor device 317 has active devices including transistors, and can include passive devices including resistors, capacitors, and/or inductors formed in a semiconductor substrate using semiconductor processing. Bond wires 313 couple the circuitry in the semiconductor device 317 to conductive pads on the first surface of substrate 303. The bond wires can be gold, copper, aluminum, and alloys including gold, copper or other conductive materials. A die attach adhesive 315 attaches the semiconductor device 317 to the first surface of substrate 303. In FIG. 3, vias 307 extend through the substrate 303. Conductors 311 form electrical paths to connect the terminals on the upper surface of substrate 303 to the vias such as 307. Substrate 303 can be a rigid laminate such as FR-4, a flame retardant glass reinforced epoxy resin material commonly used for PCB and electrical substrate materials. Alternative substrates include bismaleimide-triazine (BT) resin, epoxy resins, and polyimides. Film materials such as Kapton can be used. In FIG. 3, substrate 303 includes a rigid laminate core 321, such as FR-4, and can include redistribution layers of dielectric materials and conductors on the first surface (the upper surface when oriented as shown in FIG. 3), on a second opposite surface (the bottom surface when oriented as shown in FIG. 3), or both.

Terminals 305 are arranged in an array on the second surface of substrate 303. At least some of the terminals 305 are electrically coupled to the semiconductor device 317. The terminals 305 in FIG. 3 are solder balls. Solder balls are round or spherical balls that melt at relatively low temperatures to allow for surface mounting of the BGA package 300. Lead-free compositions for solder balls include SnAgCu (SAC) eutectic solder in various ratios. Lead solder balls can include tin (SnPb) in a eutectic composition. Increasingly, lead-free solder balls are used. As described hereinbelow, a thermal reflow process can be used to surface mount the BGA semiconductor package 300 to a printed circuit board by partially melting the solder balls onto corresponding lands, or pads, of the printed circuit board.

Figure 4:
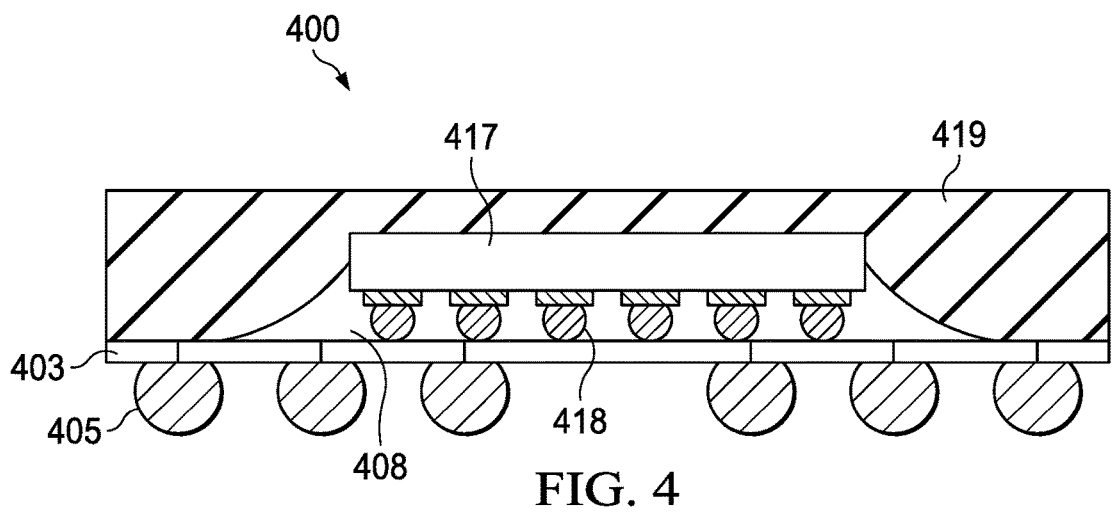
FIG. 4 is a cross section of a flip chip BGA package.

FIG. 4 illustrates in a cross section an alternative package for a semiconductor device 400. In FIG. 4, reference labels for elements similar to those in FIG. 2 are similar, for clarity. For example, substrate 403 corresponds to substrate 203. In FIG. 4, a semiconductor device 417 is arranged in a "flip chip" orientation. Circuitry such as active devices or passive devices fabricated in semiconductor device 417 are formed and are coupled to pads that carry die terminals 418. These terminals 418 can be referred to as "micro-bumps" or "die bumps." In the arrangement of FIG. 4, the die bumps 418 are solder material formed into spherical shapes placed on the pads. The semiconductor device is oriented so the die bumps are over and in correspondence with conductive terminals on a first surface of substrate 403. As shown in FIG. 4, the semiconductor device 417 mounts "face down" to the first surface, which is the upper surface of substrate 403 as oriented in FIG. 4. The die bumps 418 provide electrical and physical connection between semiconductor device 417 and substrate 403. A thermal reflow process melts the solder die bumps and forms bonds to conductor pads on substrate 403 (not visible in FIG. 4). Substrate 403 can be a rigid laminate of materials described hereinabove, including one of FR-4, BT resin, and polyimide. Substrate 403 can also be a film based substrate such as Kapton. In another alternative a ceramic substrate can be used as substrate 403. Because the pads on semiconductor device 417 are placed facing the first surface of substrate 403, while the pads of semiconductor device 317 are placed facing away from the first surface of the substrate 303, the package 400 is said to be a "flip-chip" package, and the semiconductor device 417 is said to be mounted "face down" relative to the wire bonded semiconductor package 300, in which the semiconductor device 317 is said to be mounted "face up" (see FIG. 3). Package 400 is an "overmolded" package. The semiconductor device 417, including the underfill layer 408 which provides mechanical stress relief for the micro-bumps 418, is covered by a molding compound 419. Molding compound 419 can be a thermoset epoxy applied in a transfer molding operation. Other covering materials used for semiconductor packaging can be used, such as resin, "glob top," epoxy, and other dielectric materials. "Encapsulation" can refer to the molding processes used, however the second surface of substrate 403 carrying the terminals 405 (the bottom surface as oriented in FIG. 4) is not covered by the molding compound, nor are the terminals 405, which are solder balls in the BGA package of FIG. 4.

Figure 5A:
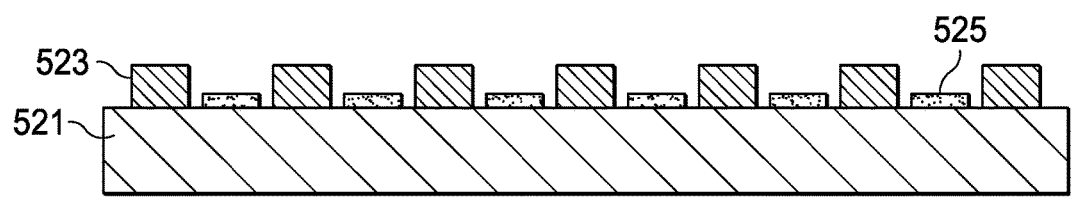
FIGS. 5A-5B are cross sections illustrating a printed circuit board assembly process for mounting a BGA package.
Figure 5B:
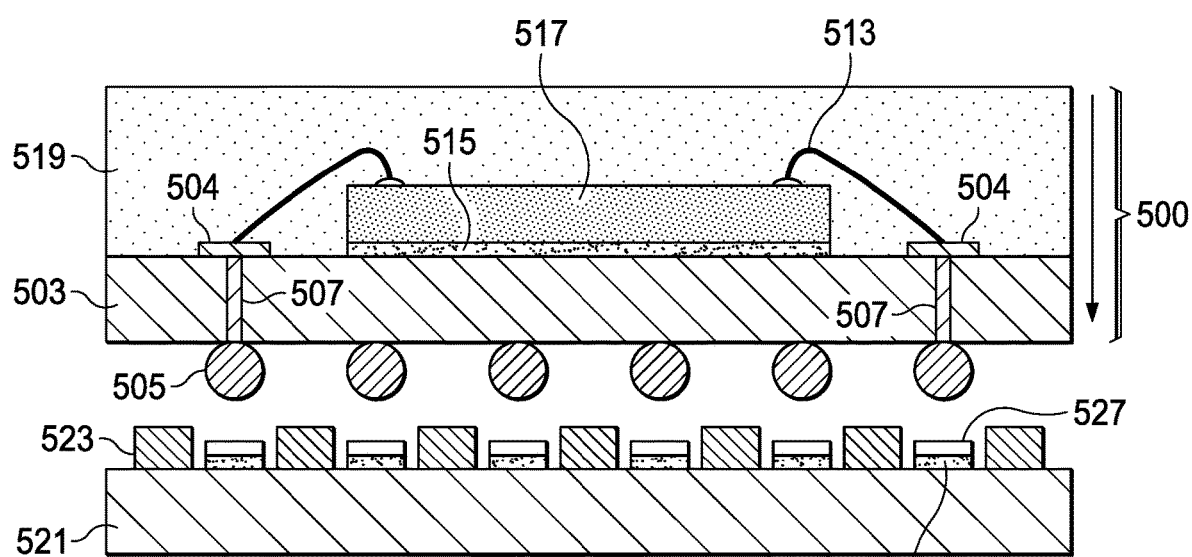

FIGS. 5A and 5B illustrate the mounting of a BGA package to a PCB. FIG. 5A is a cross section of a PCB 521. The PCB 521 has lands, also referred to as pads, 525 on a first surface, which is the upper surface of the PCB 521 as oriented in FIG. 5A and FIG. 5B. PCB 521 can be a rigid laminate, a ceramic, or another insulator material. PCB 521 can be a multiple layer circuit board including conductive layers spaced by dielectric material, and connected with vertical vias between layers. Pads 525 are formed in openings in a dielectric layer 523. Dielectric layer 523 can be a solder mask material, solder mask is a layer of insulating polymer that prevents solder bridges and prevents oxidation of conductor traces (not shown) on the upper surface of PCB 521.

In FIG. 5B, a cross section of PCB 521 is shown in a surface mount operation for a BGA package 500. In FIG. 5B, reference labels for elements similar to those in FIG. 2 are similar, for clarity. For example, substrate 503 corresponds to substrate 203. BGA package 500 has molding compound 519 covering a wire bonded semiconductor device 517, bond wires 513 coupling bond pads (not shown) of the semiconductor device 517 to conductive terminals 504 on a first surface of substrate 503 (the upper surface as oriented in FIG. 5B), and terminals 505 which are solder balls in an array pattern. Electrical connections such as vertical vias 507 couple the conductive terminals 504 to the solder balls 505. Additional conductive traces (not shown) can be used on the substrate 503 to make electrical connections between the solder balls 505 and the pads 504, such as redistribution layers. The solder balls on BGA package 500 are arranged to correspond to the pattern of the pads 525 on PCB 521.

In FIG. 5B, flux 527 is shown on the pads 525 on PCB 521. The flux is used in a thermal reflow process to surface mount the BGA package 500 to the PCB 521. The solder balls partially melt and bond to the pads 525, making electrical and mechanical connection of the BGA package 500 to the PCB 521.

Because the pattern for the solder balls 505 has to correspond to the pattern of the pads 525, design rules for the pattern of the solder balls 505 include minimum pitch requirements from the design rules for the pads for the PCB. Minimum spacing between the pads 525 is needed to prevent solder bridges and shorts between the solder balls 505.

Vertical vias (not shown) in the PCB are sometimes used to route signals away from the pads, especially for pads which are not on the periphery of the pinout of the package mounting pattern for the BGA device. Lands or pads which are not on the periphery of the pinout have limited options for routing away or "escaping" from the package mounting area due to the close proximity of adjacent pads and the corresponding pad-to-trace spacing design rules. Therefore, PCB pads which are not on the periphery of the pinout sometimes require vertical vias instead of conductive traces to escape the package mounting area and comply with pad-to-trace spacing design rules. In such cases, when vertical PCB vias are used, there are design rules which limit the minimum via-to-via spacing to ensure robust PCB manufacturing. A direct relationship between via-to-via spacing, pad-to-pad spacing, and terminal-to-terminal spacing can be established wherein the minimum via-to-via spacing design rules dictate the minimum terminal-to-terminal spacing.

Recent data signaling standards emphasize the use of serial connectivity between devices. In contrast to parallel connected busses shared between many devices, in a serial signaling system, endpoint devices are directly coupled to the next node in the system. Traces on a circuit board for the serial signals have one transmitter and one receiver. In the serial signaling systems, the connections are not subject to the inconsistent loading and various trace lengths of shared parallel busses that can require reduced operating speeds. Because the serial connections are between two devices, not more, the traces between these devices can be made of uniform length and are of uniform loading, and high-frequency operations can be made robust and effective. Data skew problems associated with parallel bus architectures are eliminated by the use of the serial connections.

An example increasingly used serial signaling communications standard is the Peripheral Component Interconnect Express (abbreviated "PCIe" or "PCI-e"). PCIe is a high-speed serial bus for computer expansion. PCIe is used, for example, in data servers where massive data stores are coupled to store and retrieve data for servers connected to the internet, for example. In another example, solid state drives (SSDs) are connected using PCIe cards. PCIe physical signals use differential signal pairs in dual-simplex operation. The links between devices are one, two, four, eight or more "lanes." Each lane has a transmit pair of differential signals and a receive pair of differential signals. The PCIe data is self-clocking so no clock signals are sent between devices. Additional examples of serial signaling busses include Serial ATA, FireWire (IEEE 1394), RapidIO, and standards for digital video such as HDMI. The arrangements herein are applicable to differential and single-ended interfaces, and to other high-frequency signaling standards with increasing word widths, where an increasing number of signaling traces is needed as bandwidth continuously increases. Currently the PCI Express 5.0 specification has been announced with an expected bandwidth of 32 Giga-Transfers per second (GT/s) per differential interface.

High-frequency signals coupled on conductive traces in close proximity are subject to cross-talk and noise from unwanted coupling between traces or terminals. Because a conductive trace switching at a high frequency acts as an antenna, signals on a conductive trace (such as on a copper signal on a printed circuit board) can couple onto other traces on the PCB or to other terminals. To isolate the signals and reduce cross-talk, ground signals or terminals are placed between the signal traces or terminals. These ground signals add additional terminals and pins to the physical interfaces. As the number of communication signals increase (wider word), the ground pins between the increasing signals further increase the number of pins for the interface, and the area on a PCB for coupling to the devices increases.

A PCB for a system can have multiple layers of interconnect separated by dielectric layers, and vertical vias can be used to connect from layer to layer. To maintain uniform loading and high performance, it is preferred to use traces at the level of conductors nearest the surface of the PCB for high-frequency signals and to avoid use of vias on these signals. This desired design puts additional constraints on the PCB design, and adds constraints on the design of devices such as BGA packaged integrated circuits to be mounted on the PCB.

Figure 6:
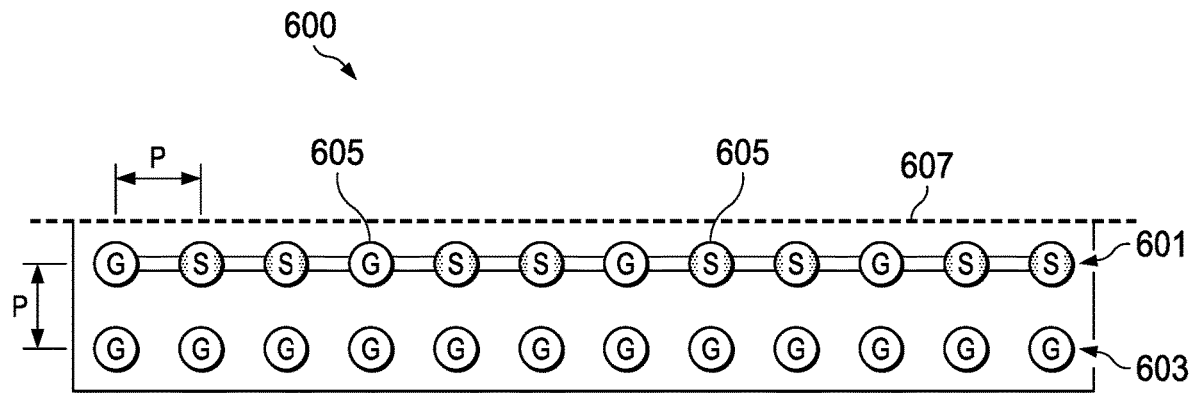
FIG. 6 is a plan view of a portion of terminals for a semiconductor package.

FIG. 6 is a plan view of a portion of an array of terminals for a semiconductor packaged device 600 including a differential signaling bus. In an example, the terminals are solder balls and the package is a BGA package. In FIG. 6, the terminals 605 are arranged in two rows 601, 603 extending in a longitudinal direction of the package 600 and parallel to an edge 607 at the periphery of the device. The terminals 605 include terminals for differential signals in four pairs, labeled "S", and between the pairs of differential signals S, terminals coupled to ground, labeled "G." In an adjacent row 603 each of the terminals (labeled G) is connected to ground, to provide additional isolation of the signal terminals S. The terminals 605 are spaced at a uniform pitch P. The signal terminals in FIG. 6 are arranged in a repeating pattern "SSGSSG" where ground terminals G space the signal terminals S.

In FIG. 6, the terminals carrying the differential signals labeled S in row 601 are placed adjacent the periphery 607 of the package 600. Peripheral placement of the signal terminals S allows traces to be coupled to these terminals on a PCB to escape away from the package mounting area without the use of vias, as is further described hereinbelow. Note that as is described further hereinbelow, for ground terminals G in row 601, optional additional terminals can be placed adjacent the edge 607, however the terminals carrying signals labeled S should not have additional terminals between the signal terminals S and the edge 607.

Figure 7:
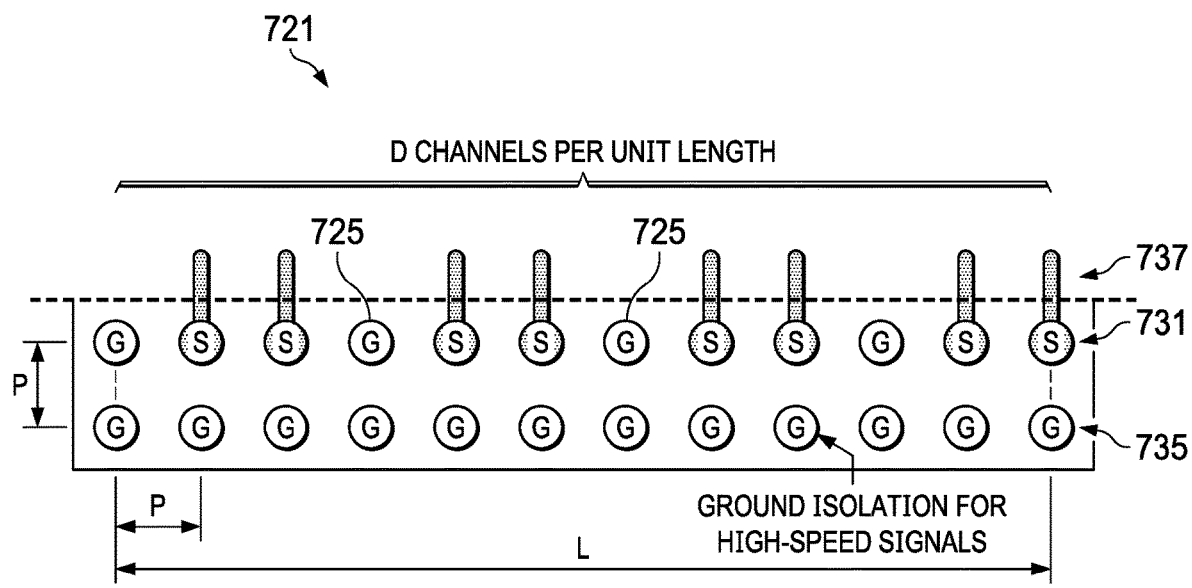
FIG. 7 is a plan view of a portion of a printed circuit board with lands for receiving a semiconductor package.

FIG. 7 illustrates in a plan view a portion of the land pattern 700 for a printed circuit board 721 arranged to receive the BGA package 600. Lands 725 are positioned on the PCB 721 to correspond to the terminals 605 in FIG. 6. Row 731 includes lands for four pairs of differential signals labeled S and ground connections labeled G between each of the pairs. Row 735 includes only lands for ground connections G to provide additional signal isolation. Traces 737 extend away from the mounting area from a peripheral edge 739 and provide routing for the signals on terminals S. Because the signal terminals S are at the periphery and the traces 737 can be routed without the need for vias in the PCB, the traces 737 can be located in the first level of conductor material used in the PCB below the surface, and routed away from the mounting area without the need for vias.

FIGS. 6 and 7 illustrate that as additional signal terminals are added, along with the needed intervening ground terminals, the length L for a given number of signals increases on both the semiconductor package (FIG. 6) and the corresponding device mounting pattern or land pattern on the PCB (FIG. 7). The density factor "D" shown in FIG. 7 is a measure of the number of channels per unit length.

Figure 8:
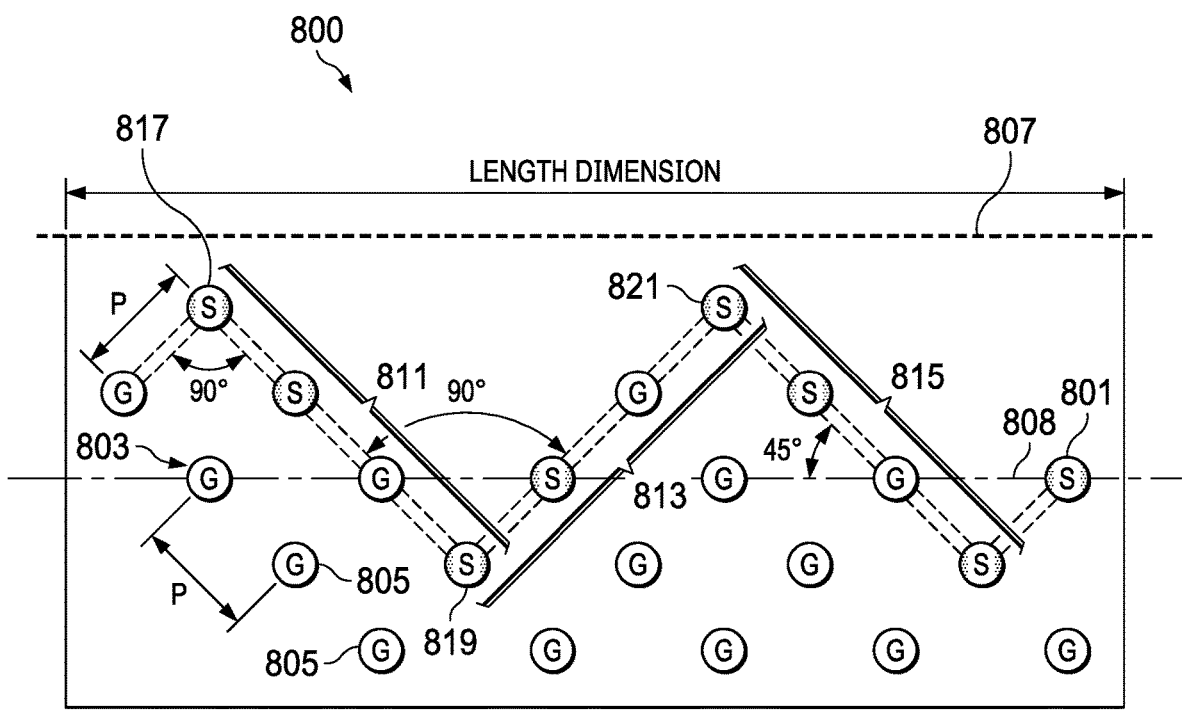
FIG. 8 is a plan view of a portion of terminals for a semiconductor package of an arrangement.

FIG. 8 is a plan view of a portion of an arrangement for a packaged semiconductor device 800. In FIG. 8, terminals 805, which can be solder balls for a BGA semiconductor package, are arranged for a differential signaling interface. Row 801 is arranged in a repeating pattern extending generally in a longitudinal direction from left to right as shown in FIG. 8. The terminals in row 801 include signal terminals S arranged in differential pairs and with ground terminals G interspersed between the signal pairs. Dashed lines between the terminals indicate the members of row 801. In an alternative, the signal terminals S can be single ended, so that a signal terminal S can be spaced from another terminal S by ground terminals. Differential signals use a small voltage difference transmitted on a pair of signals. At a receiver a negative difference can be interpreted as data at a first logical state, and a positive difference can be interpreted as data at a second logical state, e.g., ones and zeros. Using differential signaling allows for a small voltage swing, which reduces rise time, fall time and settling time after a transition and therefore increases transmission speeds. In FIG. 8, row 801 is positioned adjacent a peripheral edge 807 of the BGA package 800. Row 801 has a first group of terminals 811 starting with terminal 817 and ending with terminal 819 that extends generally in the longitudinal direction of the package 800. The first group 811 is angled relative to a longitudinal line 808 shown parallel to the peripheral edge 807. In the package 800 of FIG. 8, the first portion is angled forty-five degrees from the longitudinal line 808. The angle can vary and can be different from the forty-five degree angle shown.

In FIG. 8, the first group 811 extends in a first direction from the periphery towards the interior of the package. A second group of terminals 813 then continues row 801 in a second direction. In this example, the second group 813 extends in a second direction that is generally continuing along the longitudinal line but intersects the first direction of the first group to form a second angle, a ninety degree angle. A different angle can be used, such as eighty-five or ninety-five degrees. The row 801 continues in a repeating pattern. A third group 815 then extends row 801 in the longitudinal direction but now extends in the first direction. This third group forms a line that intersects the direction of the second group at an angle of ninety degrees starting at the terminal 821 which ends the second group 813. As can be seen in FIG. 8, row 801 forms a zig-zag pattern that continues in the longitudinal direction. Because the terminals of row 801 are in the repeating pattern that first extends towards the periphery and then reverses extending back towards the interior of the package, the lengthwise dimension of the row 801 including the four differential pairs of terminals (labeled S) in row 801 and the intervening ground terminals (labeled G) is reduced in length when compared to the length of row 601 in the BGA package 600 in FIG. 6. In FIG. 8, a second row of terminals 803 is formed interior to and parallel to row 801. This second row 803 is shown with ground connection terminals labeled G to provide additional signal isolation for the signal terminals labeled S in row 801. The second row 803 also has the repeating pattern. The pattern can be a zig-zag pattern parallel to the pattern of row 801.

The overall pattern of the terminals 805 for the BGA package 800 can form a "herringbone" pattern when observed in a plan view. In this pattern, each row forms a zig-zag repeating pattern that extends generally longitudinally lengthwise from one side of the package 800 towards the other opposite side. Groups of terminals form portions that extend towards the periphery, and then reverse back towards the interior of the package, to form the repeating pattern. In addition, the rows are parallel to one another so that when taken together the pattern seen in a plan view resembles the bones of a herring fish, that is, a "herringbone" pattern.

In the BGA package 800 the groups 811, 813, 815 include four terminals, other groupings of more or fewer terminals can be used to form alternative arrangements. As seen at terminal 819, the groups overlap and the groups have a common terminal at the intersection of two consecutive groups. The first group 811 extends in a first direction towards the interior from the periphery of the package, and then the consecutive group 813 reverses direction starting at a common terminal 819, and extends in a second direction away from the interior towards the periphery; the next consecutive group 815 again reverses direction and extends in the first direction. The zig-zag pattern repeats along the row 801 of terminals 805, so that the row 801 extends generally in the lengthwise direction of package 800. The intersections of consecutive ones of the groups form an angle, for example ninety degrees. In FIG. 8, an angle of forty-five degrees is formed between the direction of any group of terminals in row 801 and a line 808 shown extending lengthwise across the package and parallel to the peripheral edge of the package. In alternative arrangements, these angles of ninety degrees between groups and forty-five degrees between a group and a longitudinal line can vary.

Note that not all terminals in row 801 are part of a group of four. Some terminals may be at the end of the row or the beginning of the row and may be in a group of one, two, three or four terminals. The row may not extend completely from one side of the package to the other. The rows 801 and 803 are shown extending along the length dimension of package 800. Rows with signal terminals adjacent the periphery can also extend along the width dimension of the package in a repeating pattern, such as a zig-zag. It is advantageous to place signal terminals adjacent the periphery of the package for reasons given hereinabove, and each side of the four sided package offers periphery locations for signal terminals.

The spacing between the terminals 805 in FIG. 8 is a uniform pitch, labeled "P." To increase density and reduce the overall package size, it is desirable to use a minimum spacing (minimum pitch) between the terminals. Design rules for the package 800 and for the printed circuit board that has lands arranged to receive the package determine the minimum distance for pitch P. The pitch P has to be large enough to enable surface mounting of the package 800 without risk of solder bridges, shorts and opens or other failures in electrical connections. The design rules are chosen to enable robust and cost effective manufacture of both the BGA and the traces and lands on the corresponding printed circuit board. The requirements for lithographic processes used for the printed circuit board can impact the design rules.

Figure 9:
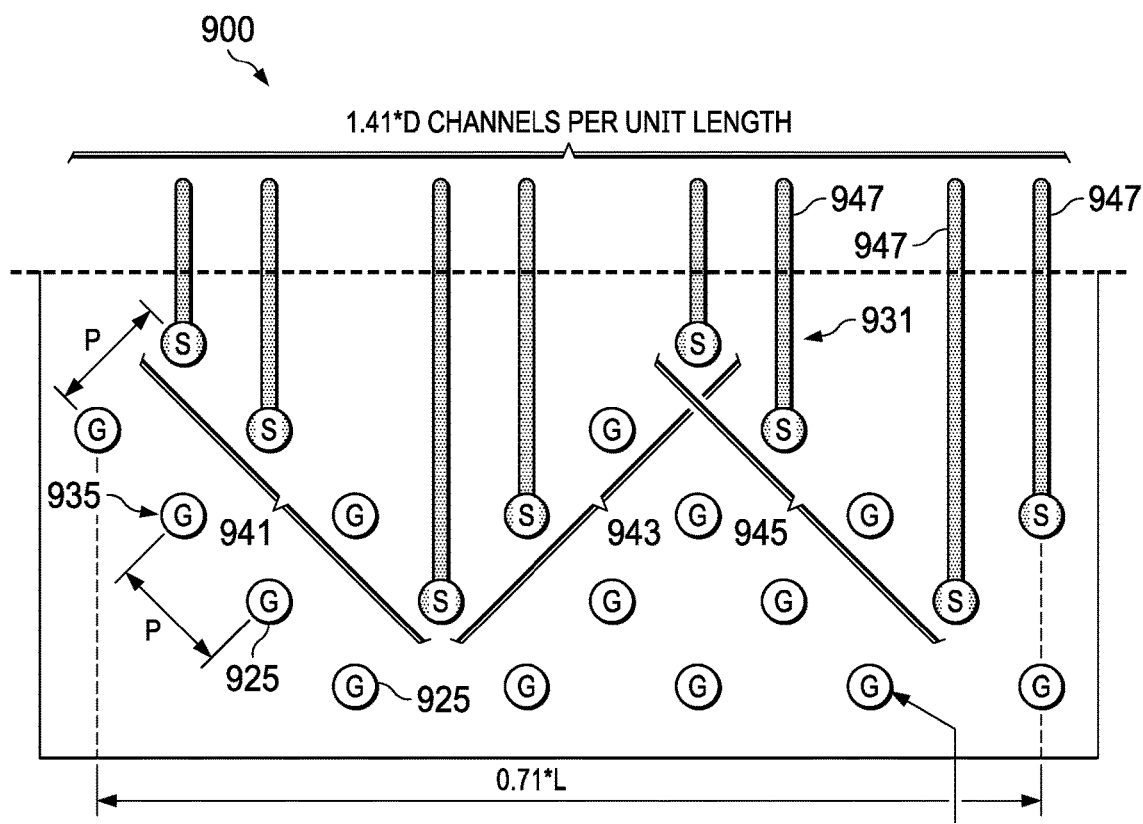
FIG. 9 is a plan view of a portion of a land pattern for receiving a semiconductor package of an arrangement.

FIG. 9 is a plan view of the land pattern for a portion of the printed circuit board 900 that corresponds to the pattern of the terminals shown in FIG. 8. In FIG. 9, a land pattern 900 for a portion of the pattern to receive the package 800 of FIG. 8 is shown. In FIG. 9, lands or pads 925 are shown arranged in correspondence to terminals 805 in FIG. 8. A first row 931 includes several groups, a first group 941 arranged to receive terminals in group 811 in FIG. 8, a second group 943 arranged to receive the terminals in group 813 in FIG. 8, and a third group 945 that continues the row first row 931. The land pattern 900 corresponds to match the terminal pattern in FIG. 8 for package 800. The rows 931, 935 zig-zag in a repeating pattern that extends generally lengthwise and that provides peripheral positions for the lands that will receive signals (labeled S), spaced by lands that will be connected to ground (labeled G). Traces 947 extending upwards in FIG. 9 illustrate the escape of signals coupled to the S pads of row 931. Because the S pads of row 931 are at the periphery of the mounting area for the BGA device, the signals can escape from the mounting area directly on the traces 947 without the need for vias in the PCB, improving performance.

The density per unit length for the signal channels in FIG. 9 is substantially increased over the arrangement shown in FIG. 7, while yet retaining the same uniform pitch spacing P between terminals. In FIG. 9, the length for the row 931 is reduced so that the signal density per unit length normalized to D in FIG. 7 is 1.41*D, an increase of 41%. Put another way, the length is reduced in FIG. 9 to 0.71*L of FIG. 7 for the same number of signal channels. As communications interfaces become wider to add additional bandwidth and therefore have more signal traces on the PCB, increasing signal density reduces the length of the land pattern and thus the board area needed for these communication signals. Note that the use of the arrangements can also modify the width and may increase the width of the package and the land pattern, however, the important channel length dimension is reduced for the same number of channels.

In an example application, an integrated circuit provides a retiming function for PCIe signals. A retimer receives, reclocks, and retransmits the signals on a printed circuit board. By retiming the signals, high-frequency performance such as 16 GT/s can be maintained over long distances between PCIe transmitters and receivers on circuit boards. In the application, the integrated circuit has eight lanes, each lane having dual simplex channels in two directions, for sixteen channels. Each channel has a transmit differential pair and a receive differential pair, for sixty four signal terminals.

Figure 10:
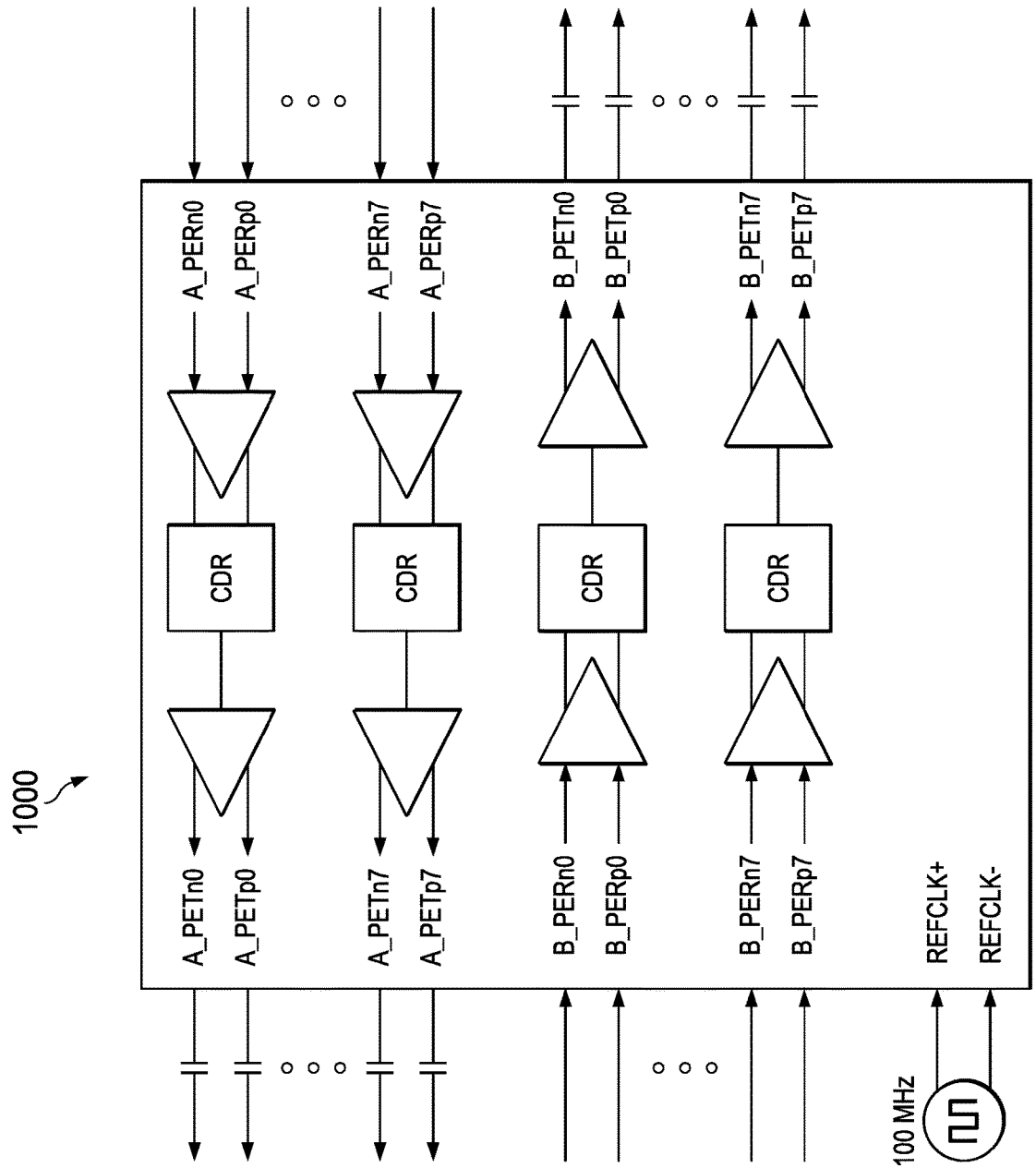
FIG. 10 is a block diagram of an integrated circuit.

A simplified block diagram is shown in FIG. 10 for the retimer integrated circuit 1000. In FIG. 10, there are eight lanes and sixteen channels, lanes A0-7 and B0-7; each channel is a differential pair (n,p) in each direction (T for transmit, R for receive), so there are sixty four signal terminals: A_PETn0, p0—A_PETn7,p7; A_PERn0, p0—A_PERn7, p7; B_PETn0,p0—B_PETn7,p7; and B_PERn0,p0—B_PERn7,p7. In the example, the package for the integrated circuit 1000 receives PCIe data on the R terminals, recovers the data in a CDR circuit, and retransmits the data on the T terminals. Data rates up to 16 GT/s are supported. In addition to the sixty four signal terminals and the corresponding ground terminals, various power, test, control and clock signals are connected. A reference clock input of 100 MHz is shown. For simplicity of illustration, not all of the connections to the integrated circuit are shown in FIG. 10.

Figure 11:
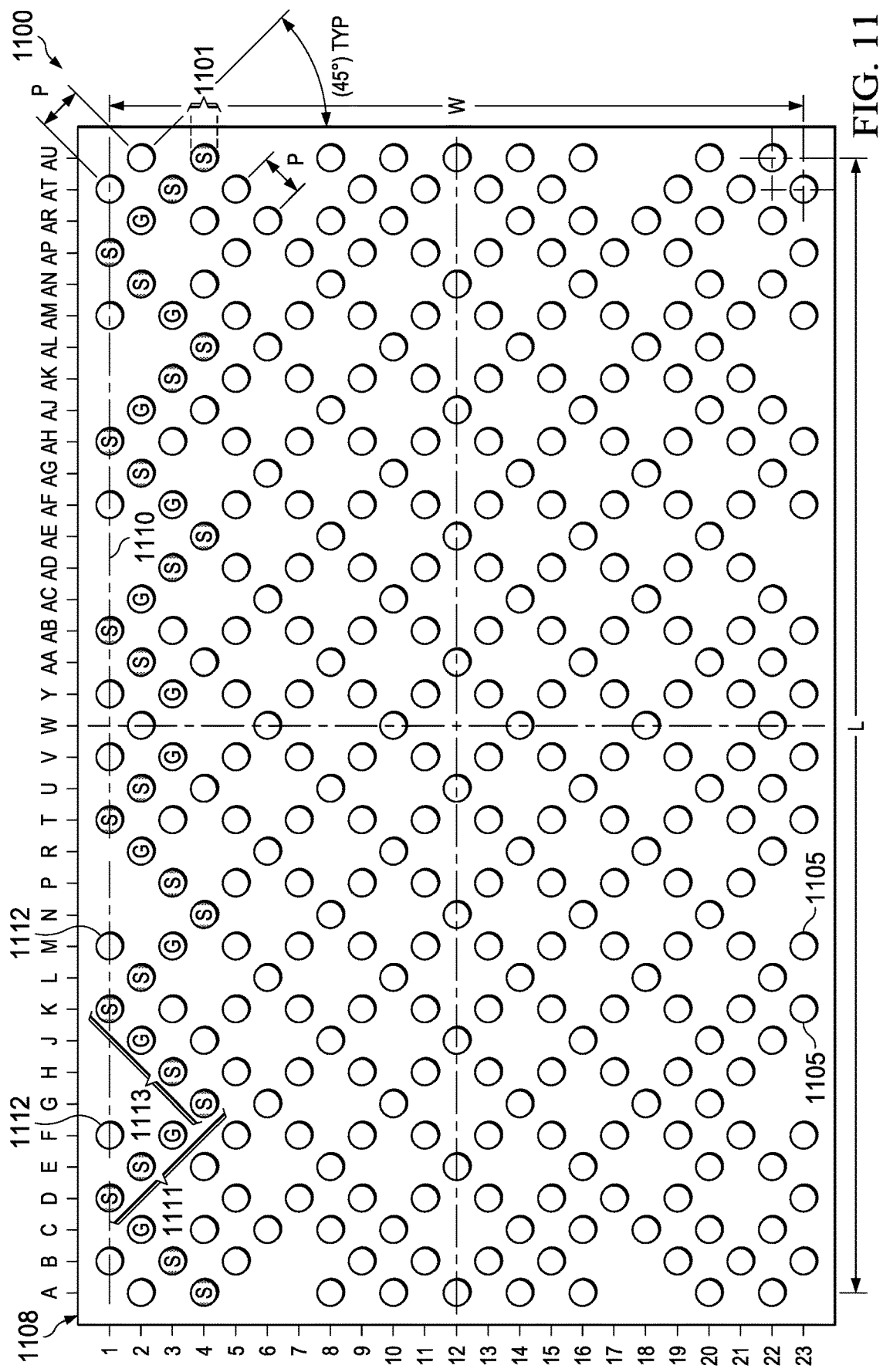
FIG. 11 is a plan view of a package arrangement for an integrated circuit.

FIG. 11 is a package outline diagram for a 332-pin flip chip ball grid array (fc-BGA) package arranged for the integrated circuit 1000 in FIG. 10. The terminals 1005 are arranged in a staggered pattern with twenty-three rows (labeled 1-23) and thirty seven columns (labeled A-Y and continuing to AA-AU). The terminals are spaced by a minimum of one position so that every other indexed position, or less, is used along a row or column. Some terminals are connected as mechanical supports and are "no connects" electrically.

In FIG. 11, a row 1101 includes a repeating pattern of signal terminals in a pattern of signal-signal-ground, signal-signal-ground, "SSGSSG", which are a differential pair of signal terminals S spaced from the next pair by a ground terminal G. As described hereinabove, row 1101 extends in a lengthwise direction from left to right in FIG. 11 and is placed adjacent a side 1108 which is a peripheral boundary of the package 1100. The terminals 1105 in row 1101 are grouped in groups of four terminals. Other arrangements can have fewer or more terminals in a group. A first group 1111 extends in a first direction away from the side 1108 towards the interior, and intersects a second group 1113 that extends in a second direction that reverses direction and extends towards the periphery. The first and second groups share a terminal at the intersection. The second direction is at a ninety degree angle to the first direction. The row 1101 is angled so that an intersection with the longitudinal line 1110 is at an angle, in FIG. 11 the angle is forty five degrees. In an alternative arrangement, other angles can be used. The signal terminals labeled S shown in FIG. 11 are only a portion of the sixty four PCIe signal terminals for the packaged integrated circuit, for clarity of illustration. The pattern SSGSSG for the example PCIe signals can be modified for a package having single-ended signals, to be SGSG or SGGSGG, for example.

While the signal terminals S in row 1101 are arranged to be adjacent to a periphery of the package 1100, there is no need that ground terminals G in row 1101 be adjacent the periphery. Terminals 1112 are optional additional terminals outside of the row 1101 and between ground terminals G in row 1101 and the periphery. These optional additional terminals can provide additional mechanical support. In an arrangement these additional terminals placed between G terminals in row 1101 and the side 1108 of the package 1100 can be connected as additional ground terminals. In another arrangement, these additional terminals 1112 can be "no connect" terminals used for added mechanical support.

Figure 12:
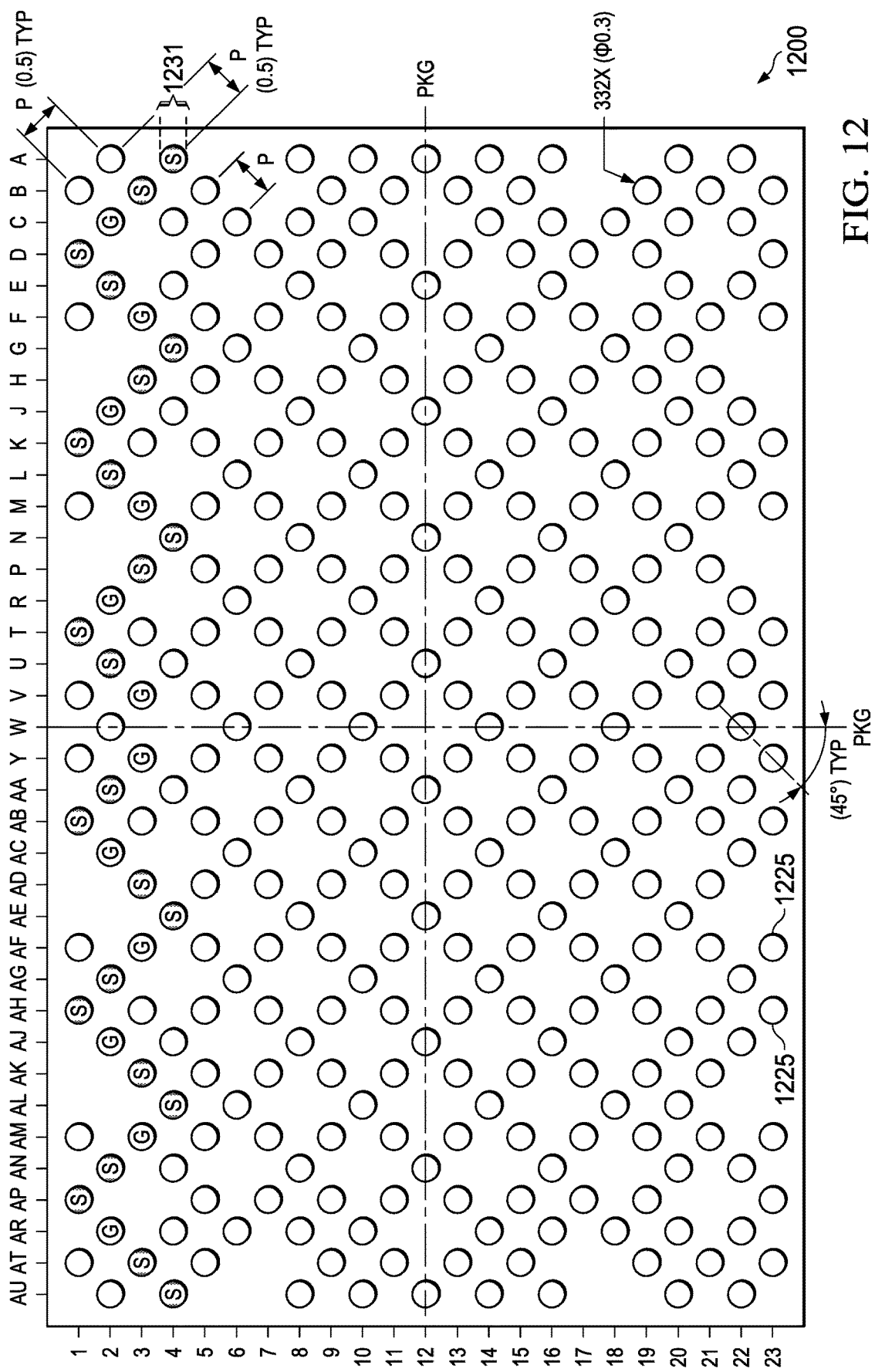
FIG. 12 is a land pattern for a printed circuit board to mount an integrated circuit package of an arrangement.

FIG. 12 is a land pattern corresponding to the package outline 1100 in FIG. 11. The land pattern can be used to arrange lands for a printed circuit board where the integrated circuit package of FIG. 11 will be surface mounted.

In FIG. 12, land pattern 1200 includes lands 1225 that correspond to the ball pattern for the ball grid array package of FIG. 11. Row 1231 includes lands for receiving the signal terminals and ground terminals in row 1101 in FIG. 11. The repeating pattern signal-signal-ground signal-signal-ground ("SSGSSG") is shown in FIG. 12 to illustrate the repeating pattern of row 1231. The lands 1225 in row 1231 extend generally in a lengthwise direction. The lands in row 1231 are arranged in directions that intersect a longitudinal line at an angle of forty five degrees. Additional signal terminals are not labeled for clarity of illustration, but the lands for signals are arranged adjacent the periphery of the land pattern, to allow for routing of traces escaping the land pattern on a printed circuit board to be free from vias in the printed circuit board.

The integrated circuit of FIG. 10, the package outline of FIG. 11, and the land pattern of FIG. 12 illustrate the arrangement of the terminals to increase channel density for a high frequency communications interface. In the example arrangements of FIG. 10, the interface is a PCIe interface. Other high frequency interfaces are applicable to the arrangements. The increased channel density can benefit systems using a variety of communications interfaces and signaling types, including single-ended and differential signals, simplex and duplex signals, and parallel bus signals.

Various modifications and combinations of the arrangements, as well as other alternative arrangements, are apparent upon reference to the description. As an example, in semiconductor technology, the arrangements apply not only to devices using solder paste as a connecting agent, but also to devices using conductive adhesive.

Modifications are possible in the described arrangements, and other additional arrangements are possible, within the scope of the claims.

What is claimed is:
1. An apparatus, comprising:
a substrate having a first surface configured to include at least one integrated circuit, and having a second surface opposite the first surface, the second surface having a plurality of terminals, the substrate having a a first, second, third, and fourth sides forming a periphery of the substrate; and
at least a first set of the plurality of terminals disposed adjacent the first side of the substrate and forming a periphery of the plurality of terminals adjacent to the first side of the substrate, the first set of the plurality of terminals arranged in a pattern, the pattern comprising a first group of consecutive ones of the terminals extending in a first direction at a first angle to a longitudinal line parallel to the first side and directed towards an interior of the substrate, a second group of consecutive terminals extending in a second direction at a second angle with respect to the first direction and extending towards the periphery of the substrate, and a third group of consecutive ones of the of the terminals extending from the second group and extending in the first direction at a third angle to the second direction and away from the periphery of the substrate, wherein the plurality of terminals is electrically connected to the integrated circuit.

2. The apparatus of claim 1, in which the first angle is an angle of forty five degrees with respect to the longitudinal line.

3. The apparatus of claim 2, in which the second angle is ninety degrees with respect to the first direction.

4. The apparatus of claim 3, in which the third angle is an angle of ninety degrees with respect to the second direction.

5. The apparatus of claim 1, in which the terminals are solder balls.

6. The apparatus of claim 5, in which the apparatus forms a ball grid array (BGA) package for the integrated circuit.

7. The apparatus of claim 1, in which the plurality of terminals include signal terminals for at least one of transmitting and receiving communication signals interspersed with ground terminals for coupling to a ground potential.

8. The apparatus of claim 7 in which the signal terminals include pairs of differential signal terminals disposed adjacent one another, the pairs spaced apart by ground terminals.

9. The apparatus of claim 8 in which the pairs of signal terminals are configured to transmit or receive PCI-Express signals.

10. The apparatus of claim 1, and further including at least one additional terminal placed between the first set of the plurality of terminals and the periphery of the substrate, wherein the at least one additional terminal is not electrically connected to the integrated circuit.

11. The apparatus of claim 1 further comprising:
   a second set of the plurality of terminals disposed adjacent the second side of the substrate and forming a periphery of the plurality of terminals adjacent to the second side of the substrate;
   a third set of the plurality of terminals disposed adjacent the third side of the substrate and forming a periphery of the plurality of terminals adjacent to the third side of the substrate; and
   a fourth set of the plurality of terminals disposed adjacent the fourth side of the substrate and forming a periphery of the plurality of terminals adjacent to the fourth side of the substrate.

12. The apparatus of claim 11, in which the first set of the plurality of terminals, the second set of the plurality of terminals, the third set of the plurality of terminals, and the fourth set of the plurality of terminals together form a periphery of the plurality of terminals from a bottom view of the apparatus.

* * * * *